(12) United States Patent
Guo

(10) Patent No.: US 11,881,462 B2
(45) Date of Patent: Jan. 23, 2024

(54) RELIABLE LATERAL FLUX CAPACITOR DESIGN

(71) Applicant: TEXAS INSTRUMENTS INCORPORATED, Dallas, TX (US)

(72) Inventor: Honglin Guo, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 441 days.

(21) Appl. No.: 17/034,435

(22) Filed: Sep. 28, 2020

(65) Prior Publication Data

US 2021/0098394 A1 Apr. 1, 2021

Related U.S. Application Data

(60) Provisional application No. 62/906,912, filed on Sep. 27, 2019.

(51) Int. Cl.
| | |
|---|---|
| *H01L 23/64* | (2006.01) |
| *H01L 27/08* | (2006.01) |
| *H01L 23/522* | (2006.01) |
| *H01L 21/82* | (2006.01) |
| *H01L 27/01* | (2006.01) |

(52) U.S. Cl.
CPC ............ *H01L 23/642* (2013.01); *H01L 21/82* (2013.01); *H01L 23/5223* (2013.01); *H01L 27/01* (2013.01); *H01L 27/0805* (2013.01)

(58) Field of Classification Search
CPC ....... H01L 23/642; H01L 21/82; H01L 27/01; H01L 27/0805; H01L 23/5223
See application file for complete search history.

(56) References Cited

U.S. PATENT DOCUMENTS

| | | | |
|---|---|---|---|
| 2009/0230507 A1* | 9/2009 | Riess | H01L 23/5223 257/532 |
| 2018/0145068 A1* | 5/2018 | Scott | H01L 27/0629 |
| 2019/0386092 A1* | 12/2019 | Cheng | H01L 28/88 |
| 2020/0020686 A1* | 1/2020 | Bao | H01L 28/60 |
| 2022/0130753 A1* | 4/2022 | Leng | H01L 28/90 |

FOREIGN PATENT DOCUMENTS

DE 102005056906 A1 * 5/2007 ......... H01L 23/5223

* cited by examiner

*Primary Examiner* — David Vu
*Assistant Examiner* — Brandon C Fox
(74) *Attorney, Agent, or Firm* — Andrew R. Ralston; Frank D. Cimino

(57) ABSTRACT

A semiconductor device includes an impedance having a first port and a second port located over a semiconductor substrate. The impedance includes at least one metal-insulator-metal (MIM) lateral flux capacitor (LFC) pair. Each LFC pair includes a first LFC connected in series with a second LFC. A terminal of the first LFC is connected to the first port, and a terminal of the second LFC is connected to the second port. Optionally the device further includes circuitry formed over the semiconductor substrate, wherein the circuitry is configured to implement a circuit function in cooperation with the impedance.

19 Claims, 6 Drawing Sheets

RELIABLE LATERAL FLUX CAPACITOR DESIGN

CROSS REFERENCE TO RELATED APPLICATIONS

This application claims priority to U.S. Provisional Application Ser. No. 62/906,912 filed on Sep. 27, 2019, which is incorporated herein by reference in its entirety.

FIELD

This disclosure relates to the field of semiconductor device manufacturing, and more particularly, but not exclusively, to improving reliability of circuits including a lateral flux capacitor.

BACKGROUND

Lateral flux capacitors include electrodes having multiple lines interleaved laterally and/or vertically. To maximize capacitive coupling between the electrodes the lines are often spaced as closely as allowed by the operative design rules. If a manufacturing defect results in a resistive short between the two electrodes, the capacitor can fail, causing the circuit in which it operates to also fail.

SUMMARY

The inventors disclose various methods and devices that may increase reliability of devices employing a lateral flux capacitor (LFC). While such examples may be expected to increase the lifetime and/or reduce the fail rate of such devices, no particular result is a requirement unless explicitly recited in a particular claim.

In one example a semiconductor device includes an impedance having a first port and a second port located over a semiconductor substrate. The impedance includes at least one metal-insulator-metal (MIM) lateral flux capacitor (LFC) pair. Each LFC pair includes a first LFC connected in series with a second LFC. A terminal of the first LFC is connected to the first port, and a terminal of the second LFC is connected to the second port. Optionally the device further includes circuitry formed over the semiconductor substrate, wherein the circuitry is configured to implement a circuit function in cooperation with the impedance.

In another example a method is provided for forming a semiconductor device. The method includes forming an impedance over a semiconductor substrate, the impedance having a first port and a second port. Forming the impedance includes forming at least one LFC pair over the substrate, each pair including a first LFC and a second LFC connected in series. The first LFC is also connected to the first port, and the second LFC is also connected to the second port. Optionally circuitry configured to implement a circuit function in cooperation with the impedance is formed over the substrate.

DETAILED DESCRIPTION

Figure 1A:
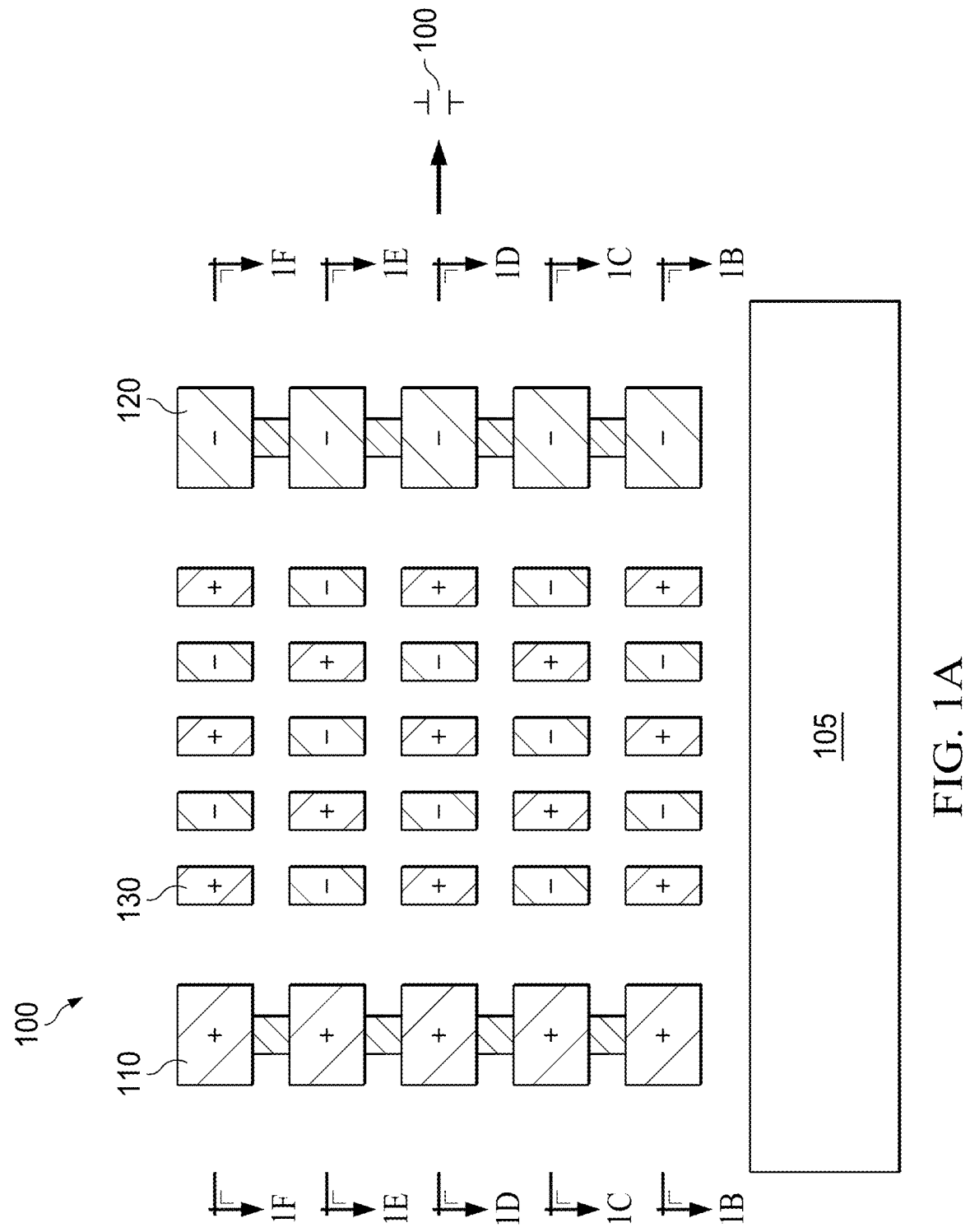
FIGS. 1A-1F illustrate a multilevel MIM lateral flux capacitor (LFC) in sectional and plan views.

The present disclosure is described with reference to the attached figures. The figures are not necessarily drawn to scale, and they are provided without implied limitation to illustrate various described examples. Several aspects of the disclosure are described below with reference to example applications for illustration. It should be understood that numerous specific details, relationships, and methods are set forth to provide an understanding of the disclosure. The present disclosure is not limited by the illustrated ordering of acts or events unless stated otherwise, as some acts may occur in different orders and/or concurrently with other acts or events. Furthermore, all illustrated acts or events may not be required to implement a methodology in accordance with the present disclosure.

Metal-insulator-metal (MIM) capacitors are sometimes used in integrated circuit devices to provide capacitance to a functional circuit, or to block DC current, e.g. a galvanic isolator. One type of MIM capacitor is a lateral flux capacitor (LFC). A lateral flux capacitor includes one or more metal levels in which closely spaced parallel metal lines are alternately connected to one of two terminals of the capacitor. In other words, lines connected to one terminal are interleaved or interdigitated with lines connected to the other terminal.

The metal lines are closely spaced to maximize the capacitive coupling between the capacitor terminals by electric field flux. Being closely spaced, a manufacturing defect may cause a low-resistance path, or resistive short, between adjacent lines and thus between the capacitor terminals. Possible defects include incomplete removal of metal between the lines, dielectric voids, and blocked etch due to the presence of a particle during resist patterning or metal etching. Even without such a defect, linewidth variability may result in outlier devices in which the space between lines may be small enough to initiate a conductive short over time. Thus a resistive short may be present immediately after fabricating the capacitor, a "time-zero" short, or may form after a period of operation. During operation an electric field between the lines may cause a short to form by dielectric breakdown often referred to as a time-dependent-dielectric-breakdown (TDDB) mechanism, for example. Such a defect manifestation may cause the device using the capacitor to fail after installation by an end-user, a clearly undesirable event. Therefore, a solution that protects a device from such failure in the event of a capacitor short is needed.

Various examples described herein provide an impedance having multiple LFC capacitors connected in series such that if one capacitor fails due to a resistive short, the remaining capacitor(s) may continue to provide capacitance between ports of the impedance. While the capacitance of the impedance may increase due to the resistive short, a circuit failure may be prevented. Such use of a redundant series capacitor increases the area used by the impedance, which is conventionally undesirable, as this reduces the number of device die that may be formed on a wafer, thereby increasing the cost of the device. For example, in the case that two capacitors of equal capacitance are used in the impedance, four times the area may be needed to provide an impedance having the desired capacitance value. While this increased device die area may be undesirable in many cases, where increased reliability is needed such a design trade-off may be desirable to the manufacturer.

Figure 1B:
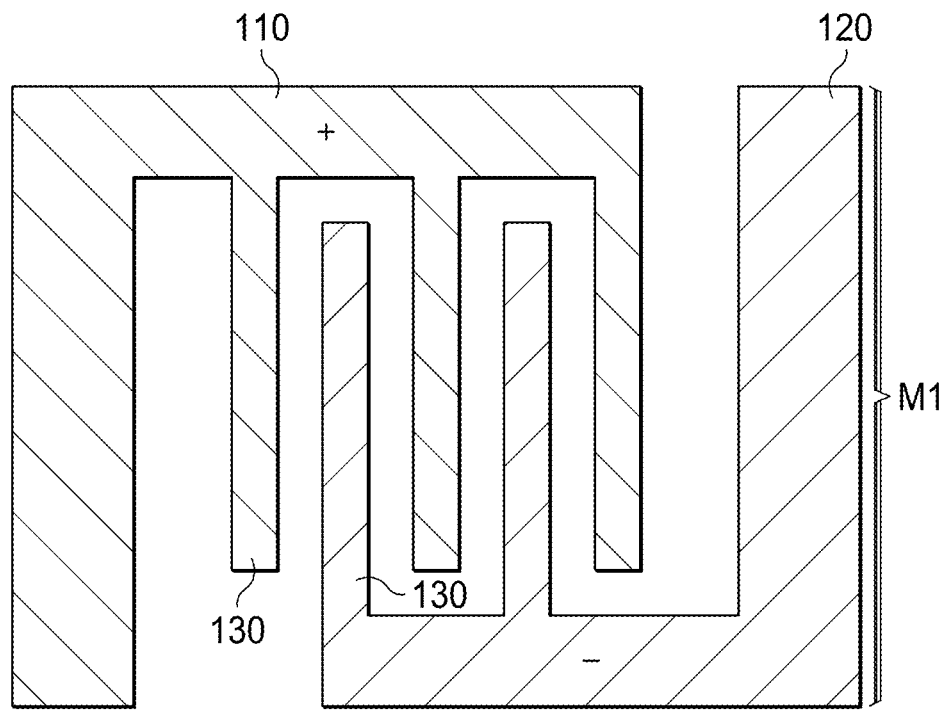
Figure 1C:
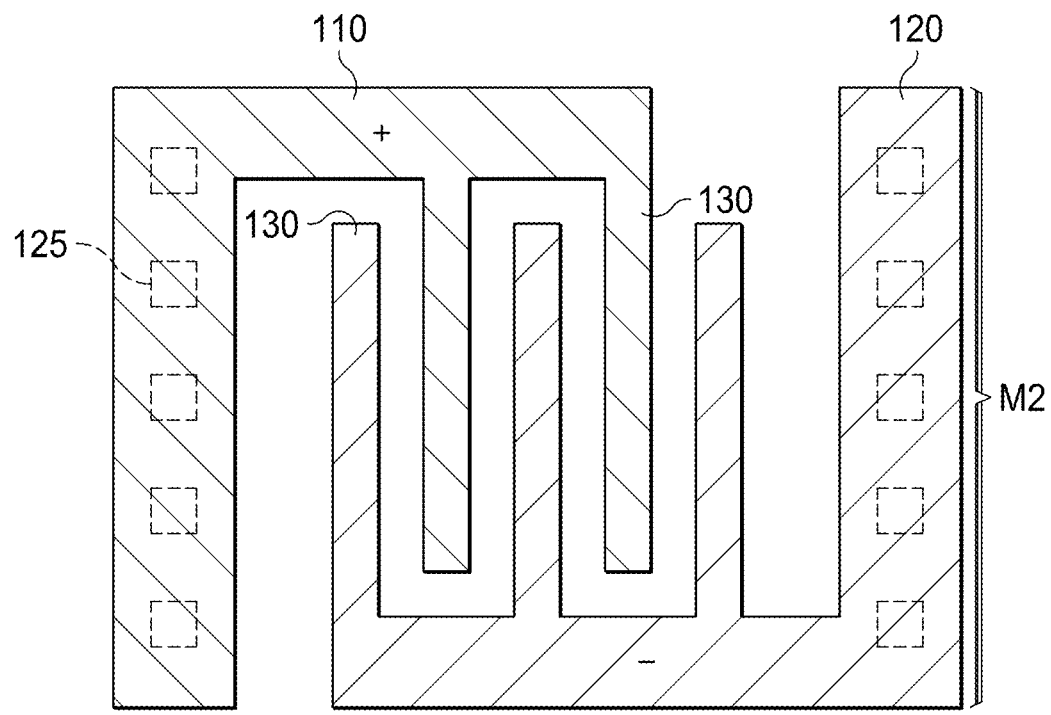
Figure 1D:
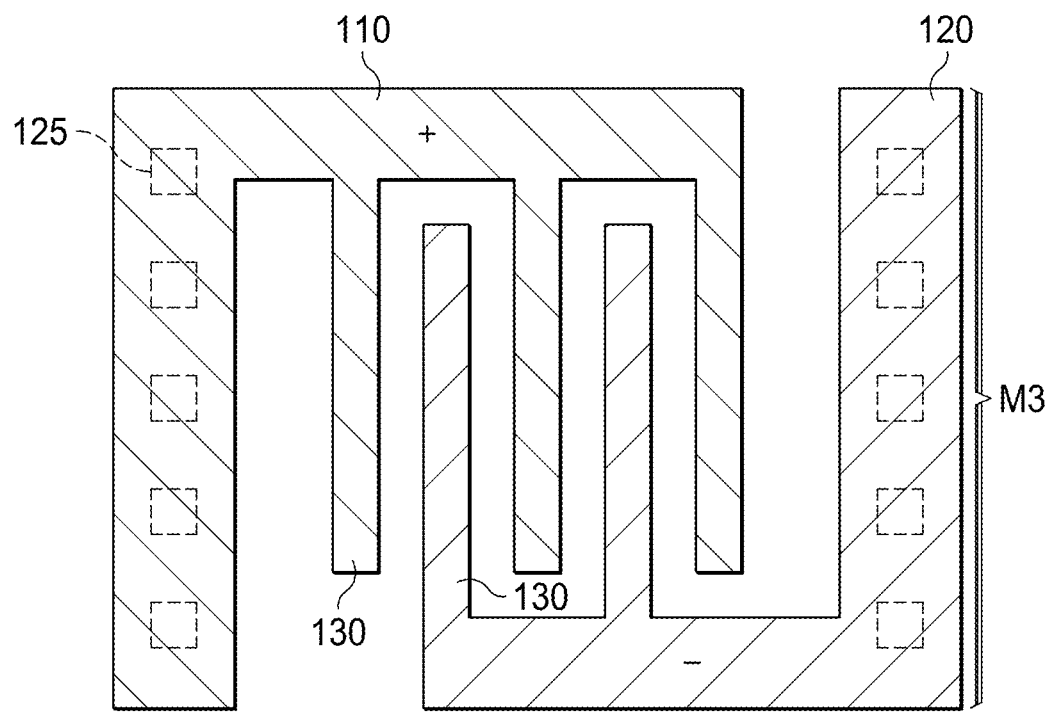
Figure 1E:
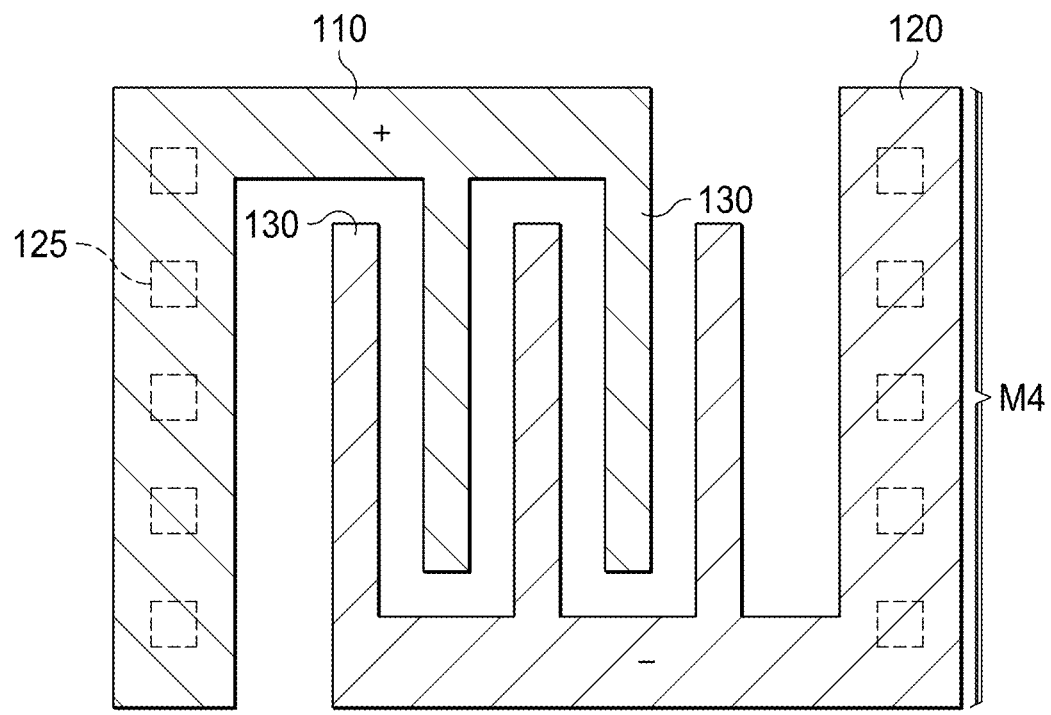
Figure 1F:
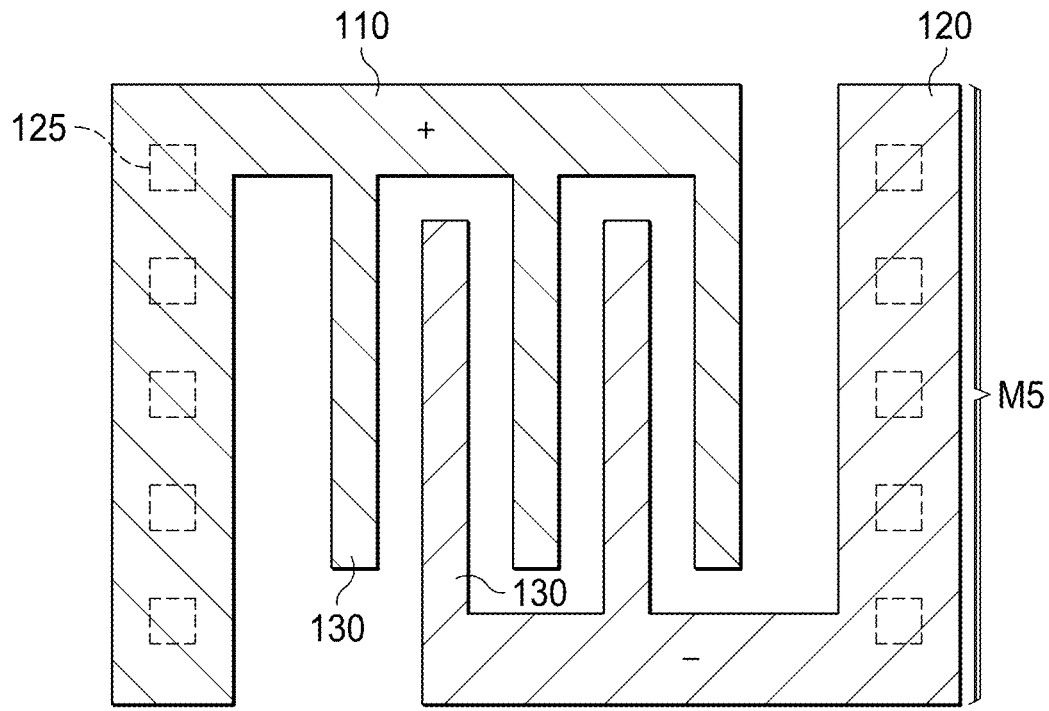

FIGS. 1A-1F illustrate aspects of a MIM LFC 100. FIG. 1A shows the LFC 100 in sectional view, while FIGS. 1B-1F illustrate various metal levels of the LFC 100. While the LFC 100 is illustrated having five metal levels, examples according to the disclosure are not limited to any number of levels more than a single level. FIG. 1B shows a MET1 level, FIG. 1C shows MET2, FIG. 1D shows MET3, FIG. 1E shows MET4, and FIG. 1F shows MET5. Each metal level includes a single level of a terminal 110 and a terminal 120. The metal levels of the terminal 110 are connected by vias 125 to produce a single conductive body, and similarly for the terminal 120. For the purpose of discussion without implied limitation, the terminal 110 is labeled "+" and the terminal 120 is labeled "−", but typically the LFC 100 is non-polar, and such labels may be reversed without effect.

In the MET1, MET3 and MET5 levels, three metal lines 130 are connected to the terminal 110 and two are connected to the terminal 120. In the MET2 and MET4 levels, two metal lines 130 are connected to the terminal 110 and three metal lines 130 are connected to the terminal 120. There may be any number of lines, the lines having any length, consistent with the desired capacitance value of the LFC 100. As shown in FIG. 1A, the metal lines 130 are arranged directly over each other over a semiconductor substrate 105 such that the metal lines 130 connected to the terminal 110 are interleaved vertically and horizontally with the metal lines 130 connected to the terminal 120. Thus the metal lines in the MET2, MET3 and MET4 levels each have as many as four nearest neighbors of the opposite type, e.g. a "+" line may have four "−" line nearest neighbors. The metal lines 130 may be formed from any desired metal type, e.g. damascene copper or etched aluminum. The LFC 100 may be represented by a standard capacitor symbol for the purpose of discussion.

The linewidth of the metal lines 130 may be any value, though wider lines increase the size of the LFC 100. The lateral spacing between the metal lines 130 may also be any value, though more closely spaced lines will have greater capacitive coupling. Similarly the vertical spacing between metal levels may also be of any value, but again metal lines with smaller vertical spacing will have greater capacitive coupling. Given these considerations, a designer may use minimum design rules to provide the greatest capacitance per unit area as possible. In one nonlimiting example the metal lines 130 have a linewidth of about 0.21 μm, a lateral spacing of about 0.25 μm and a vertical spacing of about 0.77 μm. In this context, "about" allows for typical manufacturing variability, e.g. ±10%.

FIGS. 2A-2D illustrate four examples of impedances 210, 220, 230 and 240 that may be formed using two or more instances of the LFC 100. As used herein an "impedance" is a two-port reactive component including at least two LFCs 100 connected in series between the ports. In each example two LFCs are connected in series between a first port 250 and a second port 260 of that particular impedance. Each of the impedances may be connected to circuitry configured to perform a function in cooperation with the impedance.

Figure 3:
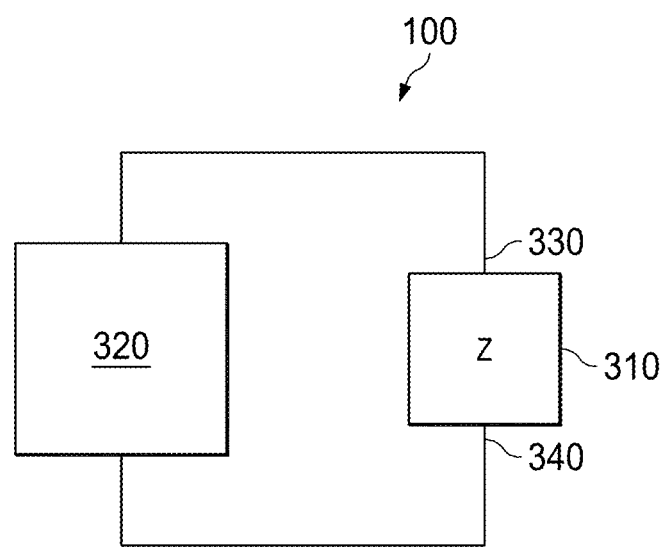
FIG. 3 illustrates an example functional circuit that cooperates with an impedance including the LFC to implement a circuit function.

For illustration FIG. 3 shows an example of an impedance 310 connected to a circuit function 320 via a first port 330 and a second port 340. The circuit function 320 may be configured to cooperate with the impedance 310 to filter, amplify, or isolate a signal, or to generate an oscillating signal, for example.

With continued reference to FIGS. 2A-2D, the connected LFCs 100 in each impedance 210-240 form a network within that impedance between the two ports. Each network includes at least one pair of LFCs 100 connected in series. For the impedances 220-240, each pair of LFCs 100 is connected in parallel with the others of the pairs. Without implied limitation, the impedance 220 has two pairs, the impedance 230 has four pairs, and the impedance 240 has 20 pairs. In principle there is no upper limit to the number of pairs of LFCs 100 in an impedance.

The capacitance value of the LFC used in each example in FIGS. 2A-2D is selected for convenience of discussion such that the net capacitance of each impedance is "C". Thus, the capacitance value of the LFC 100 is 2·C in the impedance 210, C in the impedance 220, ½·C in the impedance 230 and ⅒·C in the impedance 240. While the LFC 100 capacitance values are the same in each illustrated impedance, examples are not so limited. Similarly, while two instances of the LFC 100 are shown in each series combination in each illustrated impedance, examples are not so limited.

For the purpose of discussion a single unit of area, referred to in this discussion as a "unit", is assumed to provide capacitance value of C for a single instance of the LFC 100. Thus the LFCs 100 in the impedance 210 each have an area of two units. Since there are two instances of the LFC 100 with capacitance 2·C, the total area consumed by the impedance 210 is four units, disregarding connection overhead such as the terminals 110 and 120 and interconnections between the LFCs 100. In the impedance 220, four instances of the LFCs 100 each have an area of one unit, again for a total of four units. Similarly, each of the impedances 230 and 240 also have an area of four units.

While each impedance 210, 220, 230 and 240 may have an initial capacitance value of C, the net capacitance value of each impedance may be different in the event that a single instance of the LFC 100 develops a conductive short. In each of FIGS. 2A-2D a failure point is indicated by a lightning symbol. In the example of the impedance 210, the net capacitance may increase to 2·C, the value of the remaining instance of the LFC 100. In the example of the impedance 220, a single failure increase the capacitance value to C+C∥C, or 1.5·C. Similarly the capacitance value of the impedances 230 and 240 increase from C to 1.25·C and 1.05·C, respectively. As seen the increase of capacitance is equal to the inverse of the number of parallel capacitor legs in the capacitor network when the LFCs 100 have the same capacitance value. Thus the change of capacitance may be designed to be limited to a particular value as needed to accommodate sensitivity of the related circuit to such change.

Figure 2A:
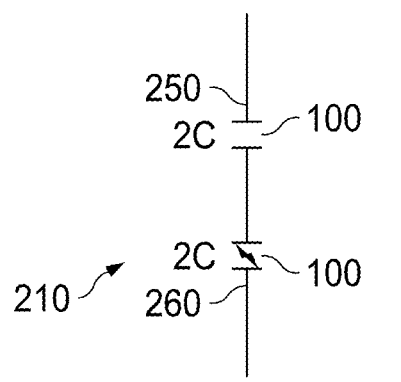
FIGS. 2A-2E shows several examples of interconnecting an LFC to increase reliability of an electronic device utilizing the flux capacitor.
Figure 2B:
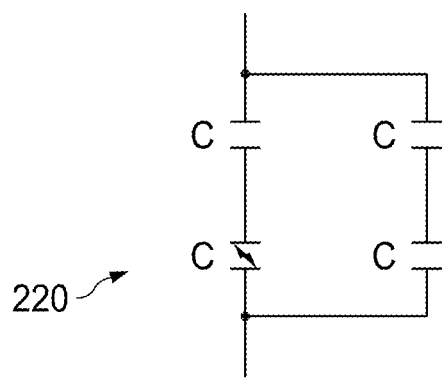
Figure 2C:
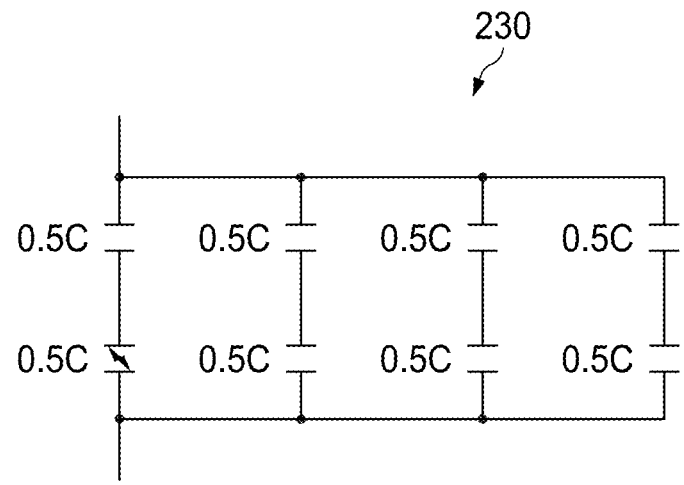
Figure 2D:
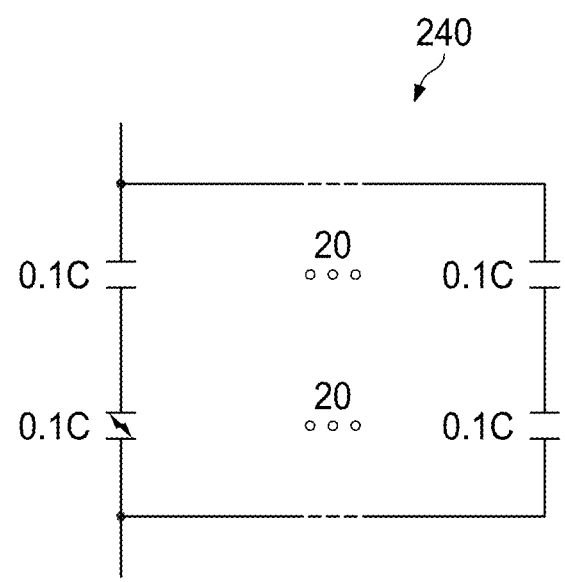
Figure 2E:
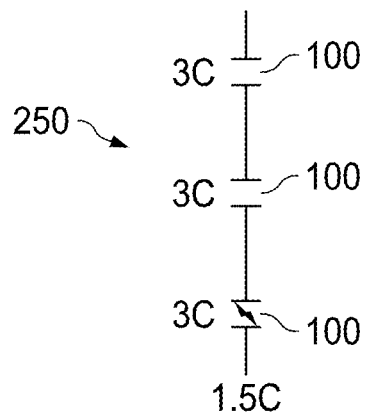

In the examples above the total area of the LFCs 100 each impedance 210, 220, 230 and 240 is four units, again neglecting connectivity overhead. Of course if more than two instances of the LFC 100 are used in a series combination, the total area used by an impedance will be larger. For example, FIG. 2E illustrates an example impedance 250 including a third instance of the LFC 100 connected in series between the first and second instances of the LFC 100. In this example each LFC 100 may have a capacitance value of 3·C for a net capacitance of C for the impedance 250. If a single LFC 100 fails with a resistive short, the capacitance value of the impedance 250 may increase to 1.5·C. In this example the total area of the impedance 250 may be nine units.

The individual instances of the LFC 100 may be located anywhere on a device die as long as interconnection is possible. Thus circuitry related to the design function of the device die may be located between two instances of the LFC 100. This feature allows the device die layout to be optimized to accommodate the presence of the LFC 100 instances. Furthermore, when more LFC 100 instances are used in an impedance, each LFC 100 is smaller. Thus it may be easier for a designer to accommodate the LFC 100 instances of the impedance 240 by placing each instance in an otherwise unused area of the device die.

Experimental data in the form of breakdown voltage in response to a ramped voltage input of a representative population of devices with impedances consistent with the impedance 210 (two LFCs in series) showed a fail rate of zero. In contrast, similar devices having a single LFC of the same capacitance value had a significant fail rate. The reduction of fail rate also resulted in a computed operating voltage entitlement increase of 300% for these particular device populations. This result may justify the area penalty resulting from the use of redundant LFCs in many design implementations, e.g. especially in situations where high reliability is desired.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

The invention claimed is:

1. A semiconductor device, comprising:
an impedance having a first port and a second port, the impedance including:
at least one metal-insulator-metal (MIM) lateral flux capacitor (LFC) pair formed over a semiconductor substrate, each pair including a first LFC connected in series with a second LFC, the first LFC connected to the first port and having a first capacitance value, and the second LFC connected to the second port and having a different second capacitance value; and
circuitry formed over the semiconductor substrate and configured to implement a circuit function in cooperation with the impedance.

2. The semiconductor device of claim 1, wherein:
the first LFC has a first set of metal lines interleaved vertically and horizontally with a second set of metal lines; and
the second LFC has a third set of metal lines interleaved vertically and horizontally with a fourth set of metal lines.

3. The semiconductor device of claim 2, wherein the first and second sets of metal lines include five levels of metal lines.

4. The semiconductor device of claim 1, wherein:
the first and second LFCs include only a single metal level;
the first LFC has a first set of metal lines interleaved horizontally with a second set of metal lines; and
the second LFC has a third set of metal lines interleaved horizontally with a fourth set of metal lines.

5. The semiconductor device of claim 2, wherein the metal lines have a linewidth of about 0.21 μm, a lateral spacing of about 0.25 μm and a vertical spacing of about 0.77 μm.

6. The semiconductor device of claim 1, wherein the at least one MIM LFC pair includes at least 20 pairs.

7. The semiconductor device of claim 2, wherein the metal lines are formed from aluminum.

8. The semiconductor device of claim 1, further comprising a third LFC connected in series between the first and second LFCs.

9. A method of manufacturing a semiconductor device, comprising:
forming an impedance over a semiconductor substrate, the impedance having a first port and a second port, including:
forming a lateral flux capacitor (LFC) pair over a semiconductor substrate, the pair including a first LFC connected in series with a second LFC, the first LFC connected to the first port and having a first capacitance value, and the second LFC connected to the second port and having a different second capacitance value; and
forming circuitry over the semiconductor substrate configured to implement a circuit function in cooperation with the impedance.

10. The method of claim 9, wherein:
the first LFC has a first set of metal lines interleaved vertically and/or horizontally with a second set of metal lines; and
the second LFC has a third set of metal lines interleaved vertically and/or horizontally with a fourth set of metal lines.

11. The method of claim 10, wherein the first and second sets of metal lines include five levels of metal lines.

12. The method of claim 9, wherein:
the first and second LFCs are formed only on a single metal level;
the first LFC has a first set of metal lines interleaved horizontally with a second set of metal lines; and
the second LFC has a third set of metal lines interleaved horizontally with a fourth set of metal lines.

13. The method of claim 10, wherein the metal lines have a linewidth of about 0.21 μm, a lateral spacing of about 0.25 μm and a vertical spacing of about 0.77 μm.

14. The method of claim 9, wherein the LFC pair is one of at least 20 LFC pairs connected in parallel between the first and second ports.

15. The method of claim 10, wherein the metal lines are formed from aluminum.

16. The method of claim 9, further comprising connecting a third LFC in series between the first and second LFCs.

17. A semiconductor device, comprising:
an impedance having a first port and a second port, the impedance including:
at least one metal-insulator-metal (MIM) lateral flux capacitor (LFC) pair formed over a semiconductor substrate, each pair including a first LFC connected in series with a second LFC, the first LFC connected to the first port and the second LFC connected to the second port, at least one of the first and second lateral flux capacitors has a first set of metal lines interleaved vertically and horizontally with a second set of metal lines, the metal lined having a linewidth of about 0.21 μm, a lateral spacing of about 0.25 μm and a vertical spacing of about 0.77 μm; and
circuitry formed over the semiconductor substrate and configured to implement a circuit function in cooperation with the impedance.

18. A method of manufacturing a semiconductor device, comprising:

forming an impedance over a semiconductor substrate, the impedance having a first port and a second port, including:
  forming at least one metal-insulator-metal (MIM) lateral flux capacitor (LFC) pair over a semiconductor substrate, each pair including a first LFC connected in series with a second LFC, the first LFC connected to the first port and the second LFC connected to the second port, at least one of the first and second lateral flux capacitors has a first set of metal lines interleaved vertically and horizontally with a second set of metal lines, the metal lined having a linewidth of about 0.21 µm, a lateral spacing of about 0.25 µm and a vertical spacing of about 0.77 µm; and
forming circuitry over the semiconductor substrate configured to implement a circuit function in cooperation with the impedance.

19. A semiconductor device, comprising:

a capacitor having a first terminal and a second terminal and including a first metal-insulator-metal (MIM) lateral flux capacitor (LFC) and a second MIM LFC formed over a semiconductor substrate, the first and second MIM LFCs connected in series between the first and second terminals, the first LFC having a first capacitance value and the second LFC having a different second capacitance value; and circuitry formed over the semiconductor substrate and connected to the first and second terminals.

\* \* \* \* \*